INVENTORS P. D. GARN
L. H. SHARPE

BY Arthur J. Torsiglieri
ATTORNEY

ETCHING BATH FOR COPPER AND REGENERATION THEREOF

Filed Oct. 28, 1957 4 Sheets-Sheet 2

INVENTORS P. D. GARN
L. H. SHARPE
BY Arthur J. Torsiglieri
ATTORNEY

ETCHING BATH FOR COPPER AND REGENERATION THEREOF

Filed Oct. 28, 1957

INVENTORS: P. D. GARN
L. H. SHARPE

BY Arthur J. Torsiglieri
ATTORNEY

Dec. 13, 1960 P. D. GARN ET AL 2,964,453

ETCHING BATH FOR COPPER AND REGENERATION THEREOF

Filed Oct. 28, 1957 4 Sheets-Sheet 4

INVENTORS P. D. GARN
L. H. SHARPE

BY Arthur J. Torsiglieri

ATTORNEY 2,964,453
Patented Dec. 13, 1960

2,964,453

ETCHING BATH FOR COPPER AND REGENERATION THEREOF

Paul D. Garn, Madison, and Louis H. Sharpe, Morristown, N.J., assignors to Bell Telephone Laboratories, Incorporated, New York, N.Y., a corporation of New York Filed Oct. 28, 1957, Ser. No. 692,889

2 Claims. (Cl. 204—130)

This invention relates to a method of etching metals by the use of a regenerable etching bath and apparatus for such method to the method of regenerating said bath, and to the composition of the bath.

In particular, this invention relates to a method of etching copper by the use of a regenerable etching bath, to the electrolytic regeneration of said bath, and to the composition of the bath.

There is considerable current interest in the production of printed wire circuits in the electronics arts, where such preformed circuits permit conservation of space and ease of fabrication. One popular method of producing printed wiring involves the foil-etch process, in which a copper foil, bonded to an insulating sheet of plastic, phenol fiber, ceramic, or some other electrically insulating material is coated with an etch resist material in the pattern of the proposed wiring. The board is thereafter dipped into an etching solution which attacks only those portions of the treated surface which are exposed.

The etching solution which has been most popular to the present time for etching copper in such foil-etch processes has been a hydrochloric acid solution of ferric chloride. Oxidation of copper by the ferric ion present in the solution proceeds according to the reaction:

$$2Fe^{+++}+Cu=2Fe^{++}+Cu^{++}$$

Such a bath has disadvantages, the most important of which involve disposal of the etchant when it is spent. When the concentration of ferric ion becomes so low that etching action is unduly slow, the bath must be renewed with fresh etchant. The old solution, which contains considerable amounts of cupric ion dissolved therein, must be disposed of. Since the solutions are corrosive, dumping becomes a problem. Financial expense is involved, not only in the mere physical removal of the bath, but also through the loss of the copper etched by and dissolved in the bath.

By the methods of the present invention, in which a bath containing cupric ion is used as the etchant, electrolytic regeneration of the etchant solution becomes possible. This regeneration not only replenishes the supply of cupric ion necessary for etching, but removes copper, dissolved by the etchant, from the solution in saleable form. The processes of etching and of regeneration, further, may be carried out simultaneously if desired, so that no time is lost in shutting down production facilities for draining and replenishing the etchant solutions, as was often required with the use of prior art etchants.

Briefly, the new etching process typically uses a bath of cupric ion containing an excess of chloride ion where an excess of chloride ions results when the number of chloride ions exceeds twice the number of cupric ions. The excess chloride ion functions to stabilize the cuprous valence state in solution, so that the usual equilibrium favoring the disproportionation of cuprous ion to elemental copper and cupric ion is displaced in favor of a reaction in which cupric ion oxidizes copper to the cuprous state, and is itself reduced to the cuprous state. This stabilization of the cuprous valence state is brought about by formation of cuprous chloride complexes in solutions containing chloride ion in excess of that normally associated with the copper ions present in a solution. The complexes have the formula $CuCl_x^{1-x}$, where $x$ is either 2 or 3. The etching reaction then is $$Cu^{++}+Cu+2xCl^{-}=2CuCl_x^{(1-x)}$$

For solutions that are low in excess chloride ions it is possible for the soluble complex $Cu_2Cl_3^{-1}$ to form.

The regeneration of the etchant is accomplished electrolytically, and reverses the reaction of the etching process. Ordinarily, if a solution containing cuprous chloride complexes, such as that found in the spent etchant, is electrolyzed at low current density, the composition of the solution will not change. This results from the fact that under such conditions the normal cathode reaction is a reduction of the cupric ion to cuprous while the simultaneous anode reaction is oxidation of cuprous ion back to cupric. No net reaction ensues, and no reduction of any copper species to elemental copper is observed. It is obvious that no useful purpose is served by such an electrolysis process.

By the methods of the present invention, a condition of concentration polarization with respect to the cupric ion present in the solution is purposely established at the cathode by reducing the size of the cathode, thus increasing the value of the current density at the cathode. By this technique of depleting the cupric ion concentration in the vicinity of the cathode, the reduction potential of the cuprous copper-copper couple can be exceeded, and metallic copper deposited on the cathode by reduction of the more plentiful cuprous ion complex. The current density at the anode is maintained at a low value, compared to the cathode. Gassing at the anode is thereby avoided.

The theory is as follows: Consider two inert electrodes immersed in the partially spent etching solution which contains cupric and cuprous ions, and consider that a current is being passed. If both electrodes are the same size, cuprous ion will be oxidized to cupric ion at the anode and cupric ion will be reduced to cuprous ion at the cathode, there being, then, no net reaction. If, however, the surface area of the cathode is made smaller and smaller while maintaining the current and the surface area of the anode constant, a point will be reached at which cupric ions will be reduced to cuprous as fast as they can diffuse to the cathode and concentration polarization occurs. If the cathode surface area is made even less, the cathode then becomes capable of reducing cupric ions faster than they can diffuse to the cathode surface. The potential of the cathode must now change and some other electrode reaction must take place in order that the flow of current be sustained. This new electrode reaction is the reduction of cuprous ion to copper. At some appropriately high value of the current density at the cathode, all of the cupric and cuprous ions which diffuse to the cathode surface will be reduced to copper. The net reaction is oxidation of cuprous to cupric ion at the anode and removal of a portion of cupric and cuprous ions from the solution as copper at the cathode.

Regeneration of the etchant solution may be a separate cycle, commencing when the etching action has ceased, or if desired, regeneration may go on simultaneously with the etching action in the same body of solution, either in the same vessel, or in physically separated but connecting vessels. When electrolysis is stopped the copper coated cathode is preferably removed from the solution to prevent redissolution of the deposit by etching action of the regenerated solution. A continuous removal of deposited copper from the etchant may be brought about by physically removing deposited copper from the cathode, as by scraping from a flexible moving cathode passing through the solution. The copper deposited on the cathode by electrolysis may also be removed electrolytically, as by replating on another electrode more negatively biased, for example.

A more complete description of the features of the invention follows. In the accompanying drawings.

Figure 1:
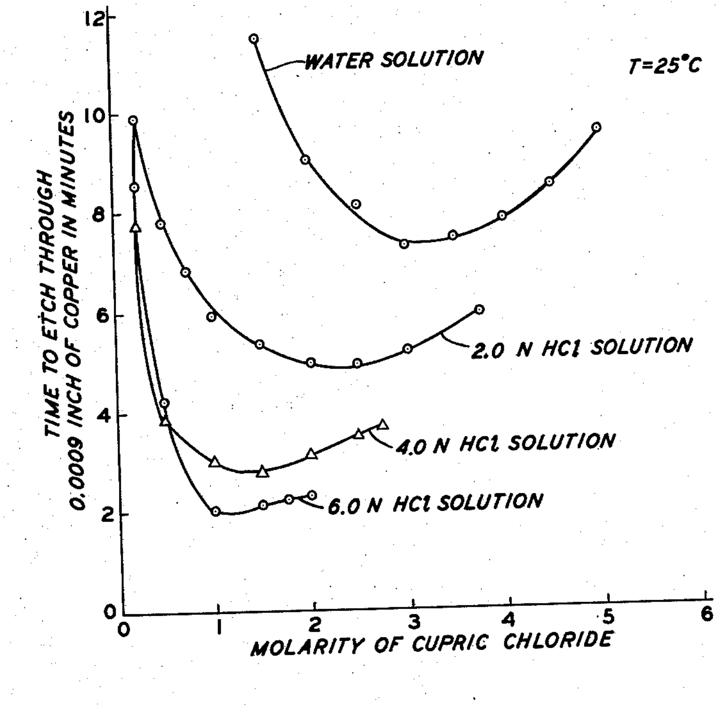
Fig. 1 is a graph showing etching time for a copper foil as a function of cupric chloride concentration for various etching baths at 25 degrees centigrade.
Figure 2:
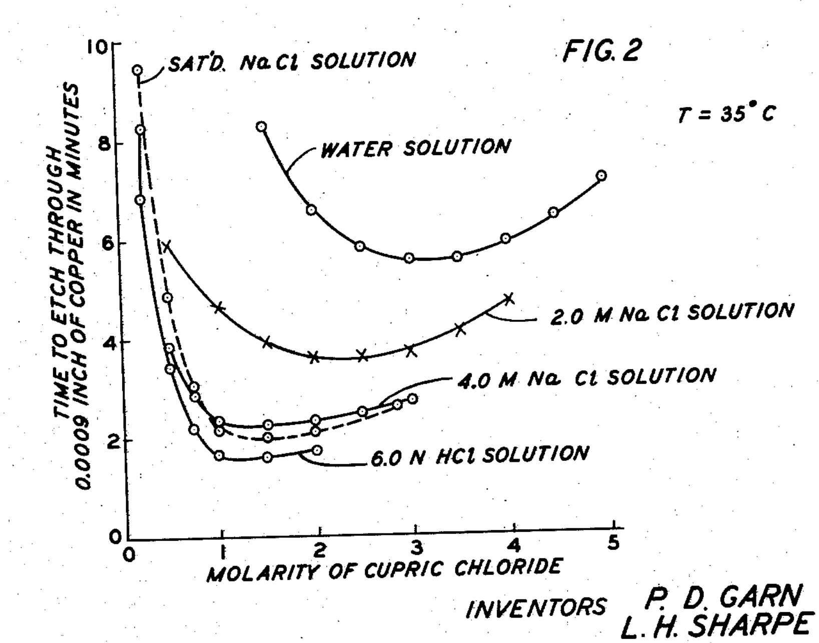
Fig. 2 is a similar graph on which etching time through a copper foil is plotted as a function of cupric chloride concentration at a temperature of 35 degrees centigrade.
Figure 3:
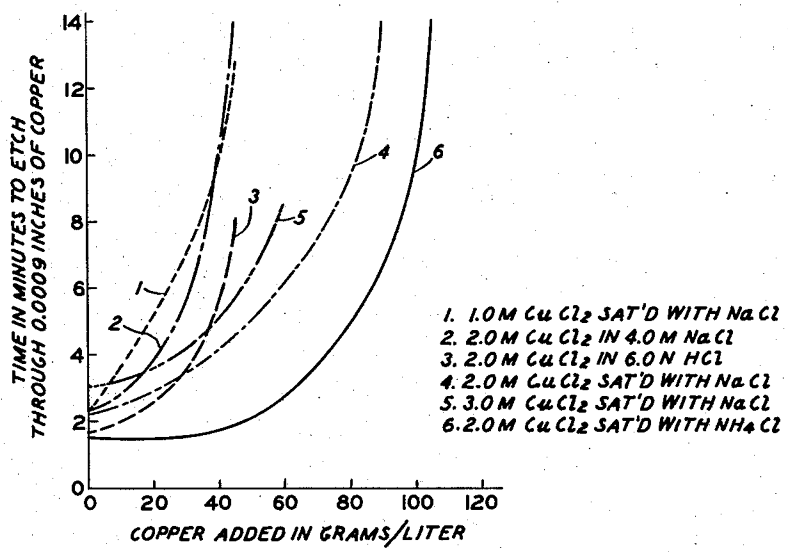
Fig. 3 is a graph on which is plotted etching time for penetrating a copper foil as a function of the amount of copper dissolved in etching baths of differing concentrations of cupric chloride and of excess chloride ion added thereto, at 35 degrees centigrade.

With reference now more specifically to the drawings, the results plotted in the graphs of Figs. 1 through 3 were obtained with an arrangement which comprised a test cell containing a measured amount of the etchant being tested as the electrolyte and two platinum electrodes, one being the cathode which has been previously plated with the desired thickness of copper and the other being the anode or reference electrode. The initial potential of the electrodeposited copper on the cathode with respect to the platinum reference electrode in the solution in which they are both immersed was measured. As the copper was etched from the electrode by the etchant solution, the potential remained steady or decreased slowly. However, as soon as the underlying platinum was exposed, the potential underwent a more or less sudden decrease and then continued to decrease more or less sharply until all of the copper was etched away, at which time the potential decreased to zero. The time at which the potential decreased to one-half of its initial value was taken as the time required to strip the original copper deposit.

In particular, from the tests made, it has been found that the preferred sources of excess chloride ions required in the cupric chloride bath are HCl, NaCl, and $NH_4Cl$. The results of tests made on these etchants are plotted in Figs. 1 through 3.

In Fig. 1, the time, in minutes, required for a cupric chloride bath to etch through a copper foil 0.0009 inch in thickness is plotted as a function of the cupric chloride concentration, for a number of solutions containing additional hydrochloric acid in different amounts. It is apparent from the graph that in each case the etching time passed through a minimum value as the concentration of cuprous chloride present in solution was increased, and that the addition of chloride ion, as hydrochloric acid for example, increased the rate of etching.

Fig. 2 is a plot of etching time through a similar copper foil 0.0009 inch thick as a function of a cupric chloride concentration at 35 degrees centigrade. The plot shows curves for simple aqueous solutions of cupric chloride and for solutions containing various additional amounts of NaCl or HCl, as sources of excess chloride ion. A comparison of Figs. 1 and 2 shows that etching rate increased with an increase in the temperature of the solution, as might be expected.

On the abscissa of Fig. 3 the time to etch through a 0.0009 inch copper foil is again plotted. The ordinate, with a scale of grams per liter, indicates the amount of copper, dissolved in a liter of a number of various specified solutions containing different concentrations of cupric chloride. Fig. 3 shows that 2 molar cupric chloride saturated with sodium chloride dissolved more copper per liter of solution, and, for a given amount of added copper had a shorter etching time than 1 molar or 3 molar cupric chloride saturated with sodium chloride.

It can be seen that two molar cupric chloride saturated with ammonium chloride dissolved more copper per liter of solution, and, for a given amount of added copper had a shorter etching time than any other solution tested.

When HCl is used, the preferred bath composition is a solution which is about 2 molar in cupric chloride and 6 normal in hydrochloric acid. For NaCl, the preferred composition is a solution which is about 2 molar in cupric chloride and saturated with sodium chloride. For $NH_4Cl$, the preferred composition is a solution which is 2 molar in cupric chloride and saturated with ammonium chloride.

For HCl, a bath composition 1 to 3 molar in cupric chloride and 3 to 7 normal in hydrochloric acid gives very good results. For NaCl, a bath composition 1 to 3 molar in cupric chloride and a high concentration of sodium chloride gives very good results. For $NH_4Cl$, a bath composition 1 to 3 molar in cupric chloride and a high concentration of ammonium chloride gives very good results. Additionally, indications are that satisfactory etching can be obtained outside these measured ranges.

Figure 4:
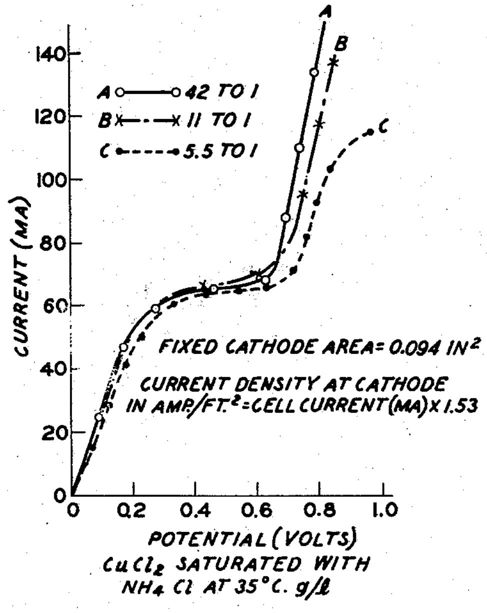
Fig. 4 is a plot of current versus cell potential in a cupric chloride solution saturated with ammonium chloride.
Figure 5:
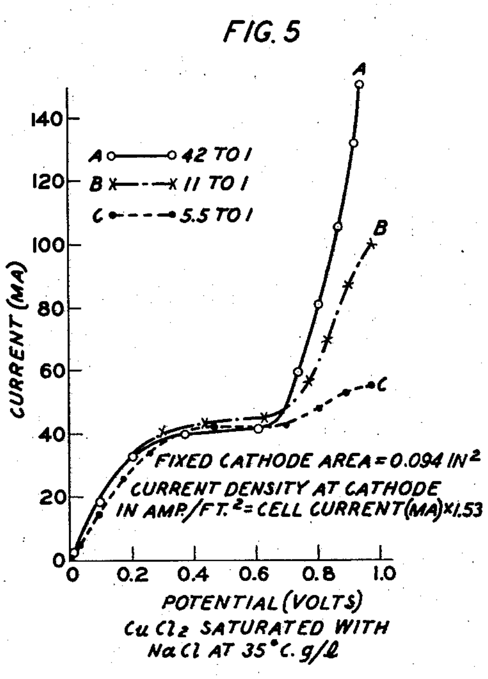
Fig. 5 is a plot of current versus cell potential in a cupric chloride solution saturated with sodium chloride.

Figs. 4 and 5 are plots of current in milliamperes on the abscissa, versus cell potential in volts on the ordinate. These results were obtained with an arrangement comprising a test cell containing the desired solution and two platinum electrodes, one being the cathode, the surface area of which was fixed, and the other being the anode, the surface area of which was varied to give the desired anode-cathode ratio. A variable voltage source was used and for various voltage values, the current value was measured. Fig. 4 shows current-voltage relationships in 2.0 molar cupric chloride solutions saturated with ammonium chloride, which as indicated above was found to provide the fastest etching rate, for a number of cells in which the anode area was varied relative to a fixed cathode area. Lines A, B and C represent differing anode to cathode area ratios. Fig. 5 shows the same relationships, for the same ratios of anode to cathode area, for solutions of 2.0 molar cupric chloride saturated with sodium chloride. Both solutions contain 20.0 grams per liter of dissolved copper as cuprous chloride complexes. In both cases a fixed cathode area of 0.094 square inch was used and the electrodes were approximately 1.5 inches apart. The curves in Figs. 4 and 5 show the same characteristics: a gradual increase in current as voltage is increased, a leveling off of the curve, and a sharp increase in the current when the potential reaches a value of about 0.6 volt. In both cases, the current increase is most steep when the ratio of anode to cathode area is the greatest.

It can be seen that when cupric chloride saturated with sodium chloride is used as the etchant, the lower limit of the cathode current density necessary to deposit copper with high efficiency on the cathode during regeneration is approximately 60 amperes per square foot. When cupric chloride saturated with ammonium chloride is used as the etchant, the lower cathode current density for high efficiency is approximately 90 amperes per square foot. When a solution which is 2 molar in cupric chloride and 6 normal in hydrochloric acid is used as the etchant, it appears that the lower cathode current for high efficiency is approximately 50 amperes per square foot. With lower values of current density, only part of the available cupric ion appears to be reduced to copper and deposited on the cathode.

For the upper limit of the cathode current density for these etchants, a restricting factor is that at a very high density value, hydrogen will be liberated at the cathode. Between this very high value and the lower density limit, satisfactory regeneration will occur. As the density is increased, there will be a range where the copper is deposited on the cathode in a smooth coat. Then, for higher values, the deposited copper will be a rough coat. Above this range, hydrogen will be liberated.

Figure 6:
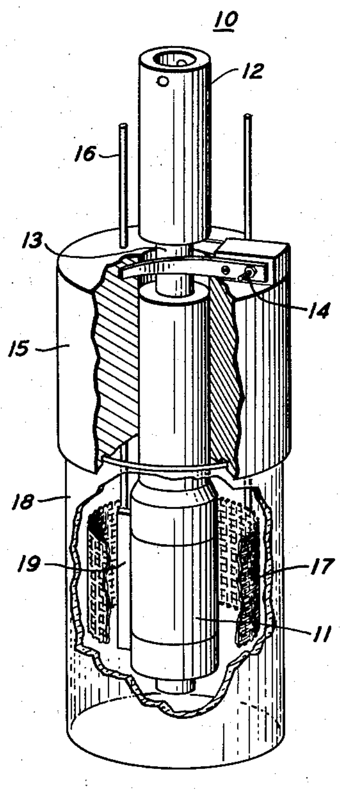
Fig. 6 shows one form of apparatus suitable for etching a copper member and regenerating the etchant, in accordance with the present invention.

Figs. 5 and 6 also show that as the ratio of the anode surface area to cathode surface area is increased, a point is reached beyond which there is not enough further increase in the regeneration efficiency to warrant increasing the area ratio further, due to the expense involved in increasing the surface area of the platinum anode. Typically, this point is reached for a ratio of 45 to 1. Some regeneration occurs so long as the anode surface area is larger than that of the cathode surface area. However, it appears desirable for rapid regeneration to have a ratio of at least three and preferably larger than five in the two surface areas.

Reference is had to Fig. 6 for apparatus 10 which was used in one instance for carrying out an embodiment of the present invention. A platinum cylinder 11, 1.5 inches square in area, is soldered to a brass ring which is fitted to the phenolic support rod 12, and sealed with adhesive so that only the outer surface of the cylinder is exposed. The cylinder 11 is electrically connected to the contact ring 13 by a wire which runs internally in the support rod 12. External electrical connection to the cylinder 11 is made through Phosphor bronze spring contacts 14 which ride on the contact ring 13. A piece of hard rubber rod 15 is drilled to permit passage of the support rod 12, a reference electrode 16, and a wire which is connected to the cylindrical platinum gauze electrode 17, which is concentric with the cylinder 11 and has a surface area about 25 times the surface area of cylinder 11, and spaced about ¼ inch from it. A glass container 18 fits into a recess in the rubber rod 15, so that the rubber rod 15 acts as a cover for the container 18. A Plexiglass stirring vane 19 provides mild agitation of the etching solution when support rod 12 is connected to the rotating shaft of a stirring motor, not shown.

In practice, etchant solution to be regenerated was placed in the glass container 15 and the cell assembled. The cell was then placed in a constant temperature bath, and a potential applied so that the platinum cylinder 11 became the cathode and the cylindrical platinum gauze 17 the anode. Copper was plated on the platinum cylinder 11 and cuprous ion was oxidized to cupric ion at the anode 17. After the solution was judged regenerated, the potential was removed and the copper allowed to redissolve. A specific etchant found especially useful for operation at room temperature with this apparatus consisted of a solution of 2 molar cupric chloride saturated with sodium chloride, which contained approximately 20 grams per liter of added copper. Such a solution was run through as many as 35 separate cycles of depletion and regeneration without showing marked changes in the characteristic etching rate.

Typical initial values of voltage and current for regeneration were 1 volt and 1 ampere. These values yielded good, almost smooth, adherent deposits of copper. To improve the efficiency of the regenerative process, it was found desirable to add small quantities of a colloid such as dextrin to the bath solution, which inhibited dendritic outgrowths at the cathode. These dendritic outgrowths of copper, which are formed due to the high current density at the cathode, tend to fall into the solution and redissolve, thus decreasing the efficiency of the regeneration process.

It is of obvious advantage to be able to maintain both the etching action and regeneration of the etching bath continuously. Such simultaneous actions enable a continuous process which is more efficient, economical and faster than prior art processes.

Figure 7:
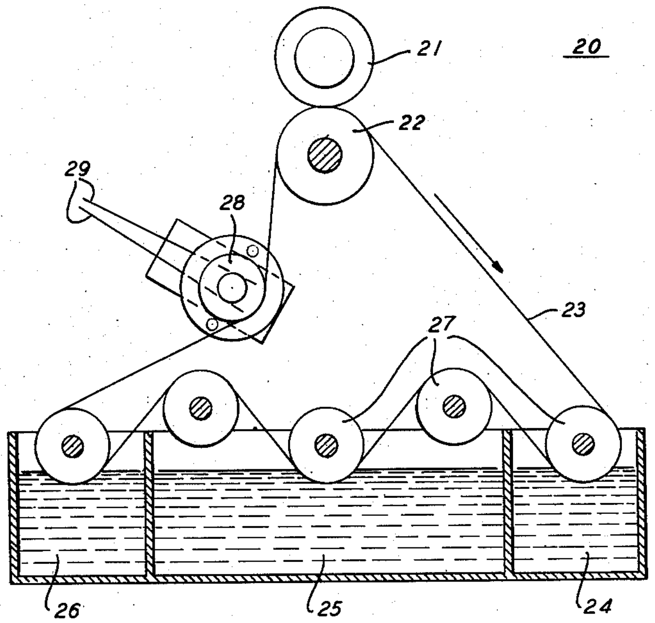
Fig. 7 shows an alternative form of apparatus suitable for carrying out the present invention.

Fig. 7 shows schematically apparatus 20 for electrolytic regeneration of the etching bath, by use of which apparatus etching and regeneration of the etchant may be carried on continuously without interruption of the etching process. In the figure are shown drive wheel 21 and driven wheel 22 opposite the drive wheel. Between the two, a flexible inert metallic member 23, for example a thin tape of platinum, passes, going then into etching bath 24, wash-water bath 25, and stripping bath 26. Wheels 27, made of an inert material, such as polystyrene, guide the member 23 through the baths 24, 25, and 26. Wheel 28, made of an electrically conducting metal, such as copper, makes contact with member 23 electrically. Through electrically conducting contacts 29, the wheel 28 can be biased positively or negatively, as desired. The bias should be such that the tape is anodic relative to a cathode (not shown) in stripping bath 26, and cathodic relative to an anode (not shown) in the etching bath 24. With this device, copper on the flexible member 23 is stripped from the member while it is anodic in stripping bath 26 and deposited on the cathode (not shown) of the stripping bath. After a wash to prevent carry-over into the etching solution, the flexible member, now cathodic relative to an anode (not shown) in the etchant 24, receives another plate of copper and returns again to the stripping bath. Etching of printed circuit boards or other copper products can go on in etchant 24 without interruption while the system above-described maintains a constant copper ion concentration in the bath. The etchant and electrode parameters typically may be as described for the apparatus shown in Fig. 6.

Figure 8:
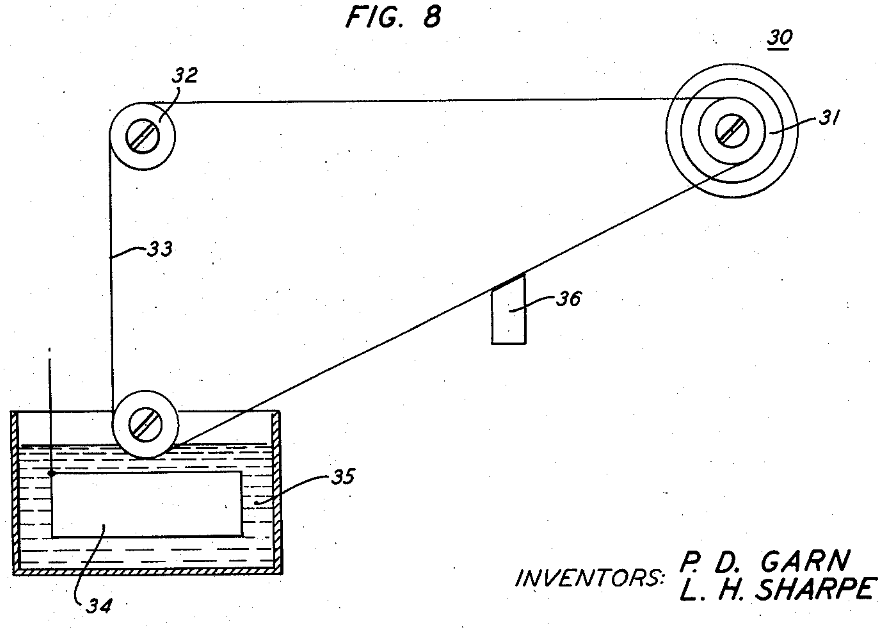
Fig. 8 shows another alternative form of apparatus suitable for carrying out the present invention.

Fig. 8 shows another form of regeneration apparatus 30 for use with the etchant described herein in a continuous process. The apparatus comprises a motor-driven drive wheel 31, an adjustable idler 32 and a flexible metallic member 33 such as a wire, strip, or chain. Driven member 33 dips into bath 35 of the etchant. Member 33 is biased negatively with respect to anode 34 in etching bath 35. Member 33, now carrying a loose deposit of copper thereon, passes over a mechanical scraper 36 having a sharp edge which removes loose copper from the surface of member 33. Flexible cathode 33 then returns to etchant bath 35 to reacquire another deposit of copper. As with the apparatus of Fig. 7, the etchant and electrode parameters may be as described for the apparatus shown in Fig. 6.

It is to be understood that the above-described examples are illustrative of the principles of the invention. Numerous other embodiments may be devised by those skilled in the art without departing from the spirit and scope of the invention. In particular, it is to be noted that HCl, NaCl or $NH_4Cl$ represent only preferred sources of excess chloride ions. Any soluble, highly ionized chloride such as potassium chloride or lithium chloride appears to be capable of supplying the requisite chloride ions. Additionally, bromides that are soluble and highly ionized such as $CuBr_2$, NaBr, $NH_4Br$, HBr, KBr, LiBr appear also to be useful for supplying excess bromide ions which perform the same function as the excess chloride ions. These bromides form the same types of soluble complexes as do the chlorides.

Although cupric chloride is the preferred bath for use in this invention, any bath which is capable of both being an etchant for copper and being changed electrolytically from the oxidation state of its exhausted condition back to the oxidation state of its fresh condition should be useful in the same way. That is, it is necessary that the ions which are reduced during oxidation of copper remain in solution and be capable of being oxidized back to their original condition. Any chloride bath meeting these requirements should undergo the regeneration process as set forth herein. For example, a ferric chloride bath could be used consistent with the spirit of this invention.

What is claimed is:

1. A method of etching copper in a regenerable etching solution and simultaneously regenerating the same solution in the same vessel which comprises etching copper in an etching bath containing a metallic chloride capable of both being an etchant for copper and going from the oxidation state of its exhausted condition back to the oxidized state of its fresh condition and an excess of chloride ions, and simultaneously electrolytically regenerating the same solution in the same vessel having a cathode and an anode, said cathode having a surface area less than said anode so that a current density gradient is established between the cathode and the anode which causes cuprous and cupric ions to be reduced to copper at the cathode and cuprous ions to be oxidized to cupric ions at the anode which, together with the cupric ions of the plating solution, are physically free to migrate to the cathode.

2. A method in accordance with claim 1 wherein the metallic chloride is cupric chloride.

References Cited in the file of this patent

UNITED STATES PATENTS

| | | |
|---|---|---|
| 507,130 | Hoepfner | Oct. 24, 1893 |
| 1,144,680 | Allers | June 29, 1915 |
| 1,851,603 | Thomas | Mar. 29, 1932 |
| 1,885,148 | Smith | Nov. 1, 1932 |
| 2,273,798 | Heise et al. | Feb. 17, 1942 |
| 2,336,846 | Clark | Dec. 14, 1943 |
| 2,748,071 | Eisler | May 29, 1956 |